United States Patent
Zhao et al.

(10) Patent No.: US 7,654,224 B2
(45) Date of Patent: Feb. 2, 2010

(54) METHOD AND APPARATUS FOR CLEANING A CVD CHAMBER

(75) Inventors: Maosheng Zhao, Santa Clara, CA (US); Juan Carlos Rocha-Alvarez, Sunnyvale, CA (US); Inna Shmurun, Foster City, CA (US); Soova Sen, Sunnyvale, CA (US); Mao D. Lim, San Jose, CA (US); Shankar Venkataraman, Santa Clara, CA (US); Ju-Hyung Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/372,312

(22) Filed: Feb. 17, 2009

(65) Prior Publication Data

US 2009/0145360 A1 Jun. 11, 2009

Related U.S. Application Data

(63) Continuation of application No. 10/354,214, filed on Jan. 27, 2003, now Pat. No. 7,500,445.

(51) Int. Cl.
*H01L 21/00* (2006.01)
*C23C 16/00* (2006.01)
(52) U.S. Cl. ............... 118/723 E; 156/345.47
(58) Field of Classification Search .......... 118/723 R, 118/723 E; 156/345.43, 345.44, 345.45, 156/345.46, 345.47; 315/111.21; 134/1.1; 216/67; 438/710
See application file for complete search history.

(56) References Cited

U.S. PATENT DOCUMENTS

| | | | |
|---|---|---|---|
| 4,960,488 A | 10/1990 | Law et al. | |
| 5,262,610 A | 11/1993 | Huang et al. | |
| 5,266,146 A | 11/1993 | Ohno et al. | |
| 5,292,400 A | 3/1994 | Mumola | |
| 5,401,350 A | 3/1995 | Patrick et al. | |
| 5,464,499 A | 11/1995 | Moslehi et al. | |
| 5,531,834 A | 7/1996 | Ishizuka et al. | |
| 5,815,366 A | 9/1998 | Morita et al. | |

(Continued)

FOREIGN PATENT DOCUMENTS

JP 01192118 8/1989

(Continued)

OTHER PUBLICATIONS

International Search Report and Written Opinion of the International Searching Authority mailed Jul. 2, 2004 for PCT/US01/002171 (APPM/007660PC).

(Continued)

*Primary Examiner*—Parviz Hassanzadeh
*Assistant Examiner*—Michelle Crowell
(74) *Attorney, Agent, or Firm*—Patterson & Sheridan

(57) ABSTRACT

The present invention is a method and apparatus for cleaning a chemical vapor deposition (CVD) chamber using cleaning gas energized to a plasma in a gas mixing volume separated by an electrode from a reaction volume of the chamber. In one embodiment, a source of RF power is coupled to a lid of the chamber, while a switch is used to couple a showerhead to ground terminals or the source of RF power.

17 Claims, 3 Drawing Sheets

U.S. PATENT DOCUMENTS

| | | | |
|---|---|---|---|
| 5,882,414 | A | 3/1999 | Fong et al. |
| 5,882,417 | A | 3/1999 | van de Ven et al. |
| 5,882,424 | A | 3/1999 | Taylor et al. |
| 5,935,340 | A | 8/1999 | Xia et al. |
| 6,077,357 | A | 6/2000 | Rossman et al. |
| 6,109,206 | A | 8/2000 | Maydan et al. |
| 6,125,859 | A | 10/2000 | Kao et al. |
| 6,199,506 | B1 | 3/2001 | Hilliker et al. |
| 6,305,390 | B1 | 10/2001 | Jeon |
| 6,495,054 | B1 | 12/2002 | Eguchi et al. |
| 6,758,224 | B2 | 7/2004 | Nogami |
| 7,569,256 | B2 * | 8/2009 | Ichijo ........................ 427/534 |
| 2001/0008138 | A1 | 7/2001 | Demos et al. |
| 2004/0144490 | A1 | 7/2004 | Zhao et al. |

FOREIGN PATENT DOCUMENTS

| | | |
|---|---|---|
| JP | 06053176 | 2/1994 |
| JP | 09272979 | 10/1997 |
| JP | 10177993 | 6/1998 |
| JP | 10280151 | 10/1998 |

OTHER PUBLICATIONS

PCT International Preliminary Report on Patentability and Written Opinion of the International Searching Authority mailed Dec. 29, 2005 for PCT/US2004/017387 (APPM/008318PC).

PCT International Preliminary Report on Patentability mailed Aug. 11, 2005 for PCT/US2004/002171 (APPM/007660PC).

* cited by examiner

| METHOD OF THE PRESENT INVENTION | | | | |
|---|---|---|---|---|
| PARAMETER | UNITS | OSG RESIDUE CLEANING PROCESS | | |
| | | MIN | MAX | EXAMPLE |
| $NF_3$ | SCCM | 500 | 6000 | 750 |
| He | SCCM | 0 | 3000 | 500 |
| TOTAL CHAMBER PRESSURE | TORR | 1 | 6 | 1.6 |
| SUBSTRATE PEDESTAL TEMPERATURE | DEGREES CELSIUS | 200 | 450 | 350 |
| RF POWER | WATT | 500 | 2500 | 1000 |
| RESIDUE ETCH RATE | Å/SEC | 120 | 250 | 195 |

METHOD AND APPARATUS FOR CLEANING A CVD CHAMBER

CROSS-REFERENCE TO RELATED APPLICATIONS

This application is a continuation of U.S. patent application Ser. No. 10/354,214, filed Jan. 27, 2003 now U.S. Pat. No. 7,500,445, which is herein incorporated by reference.

BACKGROUND OF THE INVENTION

1. Field of the Invention

The present invention generally relates to semiconductor substrate processing systems. More specifically, the present invention relates to methods and apparatus for performing deposition processes in semiconductor substrate processing systems.

2. Description of the Related Art

In the fabrication of integrated circuits, deposition processes such as chemical vapor deposition (CVD) or plasma enhanced CVD processes are used to deposit films of various materials upon semiconductor substrates. Herein such processes are collectively referred to as CVD processes. During a CVD process, chemical reactions used for depositing a desired material take place in an enclosed process chamber. When the material is deposited on the substrate, residue comprising this material, as well as by-products of the CVD process, accumulates on the internal walls and other components of the process chamber. The residue builds up, as more substrates are processed in the chamber, and leads to generation of particles and other contaminants and, as such, to degradation of the deposited films. Consequently, it is recommended to clean the interior of the CVD chamber on a regular basis.

When chamber cleaning is performed, production of the integrated circuits is temporarily interrupted. As a result, productivity of the CVD process, as measured by substrate throughput, decreases. In order to increase the productivity, it is necessary to facilitate a cleaning process that increases a number of substrates that may be processed before a need in chamber cleaning arises, as well as to decrease the duration of the cleaning process.

Generally, two types of methods are used to clean the CVD chambers. Both methods use a cleaning gas (e.g., fluorine (F) based gas) to remove post-CVD residue from the interior of the chamber and may be performed without opening the chamber, i.e., in situ.

In the first cleaning method, the cleaning gas is energized to a plasma within a remote plasma source that forms and releases into the CVD chamber free radicals and ionic species of the cleaning gas. In the CVD chamber, the radicals and ionic species chemically react with the residue and transform the residue into volatile compounds. The volatile compounds are then evacuated from the chamber. One such method is disclosed in commonly assigned U.S. patent application Ser. No. 10/122,481, filed Apr. 12, 2002, which is incorporated herein by reference.

In the cleaning second method, the cleaning gas is energized to the plasma inside the CVD chamber using a radio-frequency (RF) plasma source and, as such, the free radicals and ionic species of the cleaning gas can attack the residue and internal parts of the chamber both chemically and physically.

In the prior art, the free radicals and ionic species of the cleaning plasma readily recombine within the CVD chamber during a cleaning procedure. Recombination of the free radicals and ionic species results in formation of reactive species that may chemically react with the material (e.g., aluminum (Al), stainless steel, and the like) of components of the CVD chamber, e.g., a gas distribution plate, a susceptor (substrate pedestal), a substrate heater, a protective lining, and the like. During the cleaning process, such chemical reactions, as well as physical bombardment (e.g., an ionic bombardment) of the internal parts, may cause damage to the CVD chamber. Further, in many applications, these chemical reactions can produce non-volatile residue-like deposits (e.g., aluminum fluoride ($AlF_3$)), which also may contaminate the substrates during the following CVD processing of the substrates.

Therefore, there is a need in the art for a method and apparatus for cleaning a CVD chamber with minimal damage to the internal parts.

SUMMARY OF THE INVENTION

The present invention is a method and apparatus for cleaning a chemical vapor deposition (CVD) chamber with minimal damage to the internal parts. The method uses cleaning gas energized to RF plasma in a volume separated by an electrode from a reaction volume of the chamber. In one embodiment, a source of RF power is coupled to a lid of the chamber, while a switch is used to couple a gas distribution plate to ground terminals or the source of RF power.

BRIEF DESCRIPTION OF THE DRAWINGS

The teachings of the present invention can be readily understood by considering the following detailed description in conjunction with the accompanying drawings, in which:

FIG. 3 is a table summarizing the processing parameters of one embodiment of the present invention when practiced using the apparatus of FIG. 1.

To facilitate understanding, identical reference numerals have been used, where possible, to designate identical elements that are common to the figures.

It is to be noted, however, that the appended drawings illustrate only typical embodiments of this invention and are therefore not to be considered limiting of its scope, for the invention may admit to other equally effective embodiments.

DETAILED DESCRIPTION

The present invention is a method and apparatus for plasma cleaning, with minimal damage to the internal parts, a process chamber of a chemical vapor deposition (CVD) reactor or a plasma enhanced CVD (PECVD) reactor. Herein either reactor is referred to as a CVD reactor.

Figure 1:
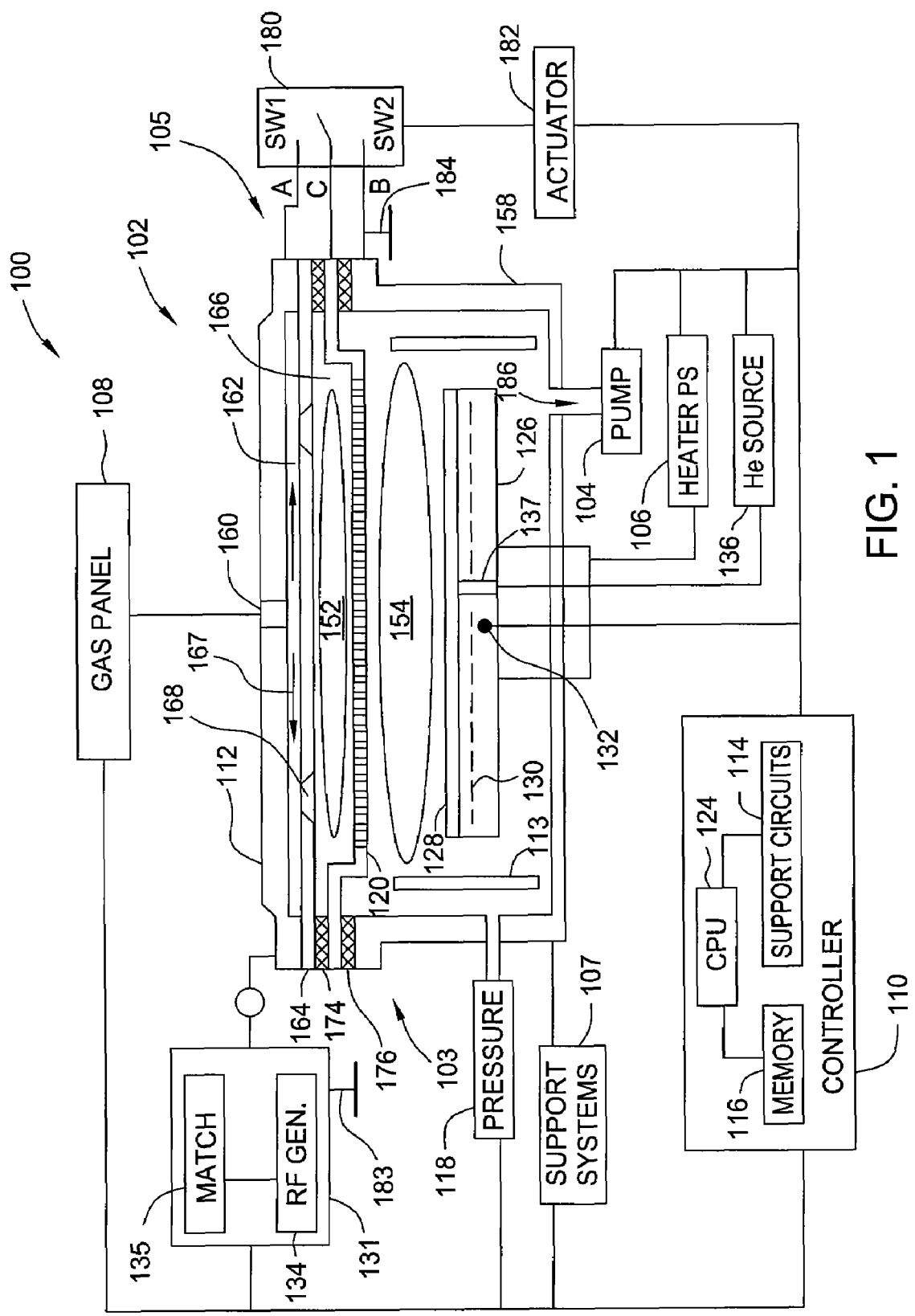
FIG. 1 depicts a schematic diagram of a plasma processing apparatus in accordance with the present invention.

FIG. 1 depicts a schematic diagram of an exemplary CVD reactor 100, which may be used to perform a cleaning process in accordance with the present invention. The images in FIG. 1 are simplified for illustrative purposes and are not depicted to scale. An example of the CVD reactor that may used to perform the invention is the PRODUCER® Reactor, available from Applied Materials, Inc. of Santa Clara, Calif. The PRODUCER® Reactor is disclosed in commonly assigned U.S. Pat. No. 5,855,681, issued Jan. 5, 1999, which is incorporated herein by reference. The PRODUCER® Reactor comprises a CVD chamber having two isolated processing regions. Each of the processing regions may be used to deposit dielectric and other materials. FIG. 1 depicts one processing region as a process chamber 102.

Other CVD reactors and chambers may also be used to practice the invention, e.g., the CVD chamber disclosed in commonly assigned U.S. Pat. No. 6,364,954 B2, issued Apr. 2, 2002, which is incorporated herein by reference. This chamber is available from Applied Materials, Inc. of Santa Clara, Calif. under the trademark DXZ®.

The reactor 100 comprises the process chamber 102, a source 131 of radio-frequency (RF) power, a gas panel 108, a source 136 of backside gas, a heater power supply 106, a vacuum pump 104, support systems 107, and a controller 110. In other embodiments, the reactor 100 may comprise at least one optional plasma magnetizing solenoid, an optional source of substrate RF bias, and an optional remote plasma source (all not shown).

The process chamber 102 generally is a vacuum vessel, which comprises a first portion 103 and a second portion 105. In one embodiment, the first portion 103 is coupled to the vacuum pump 104 and comprises a substrate pedestal 126, a protective lining 113, and a sidewall 158. The second portion 105 is coupled to the gas panel 108 and comprises a lid 112. The lid 112 further comprises an optional blocking plate 164 and a gas distribution plate (showerhead) 120, which defines a gas mixing volume 152 and a reaction volume 154.

In one embodiment, the lid 112, the blocking plate 164, and the showerhead 120, as well as the sidewall 158, are formed from at least one conductive material, such as metal (e.g., aluminum (Al) and the like) or metal alloy (e.g., stainless steel and the like). Further, the substrate pedestal 126 and the protective lining 113 may be formed from or comprise sub-components that are formed from the at least one of such conductive materials. The referred to components of the process chamber 102 may also comprise portions and/or sub-components formed from non-conductive materials (e.g., ceramic, polyimide, and the like) or from any combination of conductive and non-conductive materials. As such, scope of the present invention is not limited to the process chamber 102 having components formed entirely from conductive materials.

The substrate pedestal 126 is used to support a substrate 128 (e.g., 300 mm silicon (Si) wafer) during a CVD process. In one embodiment, the substrate pedestal 126 comprises an embedded resistive heater 130 to heat the substrate pedestal. Alternatively, the substrate pedestal 126 may comprise a source of radiant heat (not shown), such as gas-filled lamps and the like. An embedded temperature sensor 132, e.g., a thermocouple, monitors, in a conventional manner, the temperature of the substrate pedestal 126. The measured temperature is used in a feedback loop to regulate the output of the heater power supply 106 that is coupled to the heater 130 or, alternatively, to the gas-filled lamps.

The support pedestal 126 further comprises a gas supply conduit 137, which provides gas, e.g., helium, from a source 136 to the backside of the wafer 128 through grooves (not shown) in the support surface of the pedestal. The gas facilitates heat exchange between the support pedestal 126 and the wafer 128. Using the backside gas, the temperature of the wafer 128 may be controlled between about 200 and 800 degrees Celsius.

The gas panel 108 comprises process and cleaning gases, as well as equipment for regulating the flow of each gas. In one embodiment, a process gas (or gas mixture), as well as a cleaning gas, is delivered from the gas panel 108 into the process chamber 102 through an inlet port 160 disposed in the lid 112. Herein the terms "gas" and "gas mixture" are used interchangeably. The inlet port 160 is fluidly connected to a first plenum 162, where gases may diffuse radially across the optional blocking plate 164, as indicated by arrows 167. Alternatively, the process gas and/or cleaning gas may by delivered into the process chamber 102 through a separate inlet port (not shown) in the lid or showerhead.

The process or cleaning gas passes through apertures 168 in the blocking plate 164 and enters a second plenum 166 that is formed between the showerhead 120 and the blocking plate 164. The showerhead 120 fluidly connects the second plenum 166 to the reaction volume 154 via a plurality of apertures 172. The showerhead 120 may comprise different zones such that various gases can be released into the reaction volume 154 at various flow rates.

The vacuum pump 104 is adapted to an exhaust port 186 formed in the sidewall 158 of the process chamber 102. The vacuum pump 104 is used to maintain a desired gas pressure in the process chamber 102, as well as evacuate post-processing gases and other volatile compounds (i.e., during a cleaning process discussed below) from the process chamber. In one embodiment, the vacuum pump 104 comprises a throttle valve (not shown) to control gas conductance in a path between the pump and the chamber. Gas pressure in the process chamber 102 is monitored by a pressure sensor 118. The measured value is used in a feedback loop to control the gas pressure during processing the wafer 128 or during the cleaning process.

The source 131 comprises a RF generator 134 and an associated matching network 135. The generator 134 may generally be tuned in a range from about 50 KHz to 13.56 MHz to produce up to 3000 W. In one embodiment, the source 131 (i.e., the RF generator 134 and matching network 135) and the process chamber 102 are coupled to the same ground terminal 184, such as the sidewall 158. The ground terminal 184 may further be electrically coupled (i.e., short-circuited) to a common ground reference of a semiconductor substrate processing system, which encompasses the reactor 100.

The showerhead 120 and the substrate pedestal 126 together form a pair of spaced apart electrodes. When RF power is applied to either one of such electrodes while the other one is coupled to the ground terminal 184 (e.g., the sidewall 158), gas in the reaction volume 154 is ignited into a plasma. When no RF power is provided to the showerhead 120 and the substrate pedestal 126, the reactor 100 is configured to perform a CVD process. For example, to perform a PECVD process, the RF power may be applied to the showerhead 120, while the substrate pedestal 126 is coupled to the ground terminal 184. During the PECVD process, a ground reference 183 of the source 131 and the ground terminal 184 of the process chamber 102 (e.g., sidewall 158) are coupled together.

To facilitate the cleaning process, the process chamber 102 further comprises a switch 180. A common contact (i.e., contact C) of the switch 180 is coupled to the showerhead 120, while one of selectable contacts (e.g., contact A) is coupled to the lid 112 and the other selectable contact (e.g., contact B) is coupled to the ground terminal 184.

In one embodiment, the source 131 applies RF power to the lid 112, while the lid 112 is electrically coupled to the blocking plate 164. In this embodiment, the showerhead 120 is electrically isolated within the second portion 105 (i.e., from the blocking plate 164 and lid 112) and from the first portion 103 using, e.g., isolators 174 and 176, respectively. Further, the sidewall 158 and, optionally, the substrate pedestal 126, are electrically coupled to the connected together ground reference 183 and ground terminal 184.

The isolators 174 and 176 may be conventionally formed, e.g., from at least one dielectric material such as alumina ($Al_2O_3$), polyimide, and the like. The isolators 174 and 176 are also formed such that vacuum performance of the process chamber 102 is maintained, e.g., each isolator may be adapted to O-ring or other seal generally used in a vacuumed vessel, such as the process chamber 102, to vacuumize the interior of the vessel.

The switch 180 is generally a double-throw switch. Those skilled in the art will appreciate, that such connections may be performed using, e.g., two single-throw switches and the like. When the switch 180 is set to a first position SW1, the switch provides a short circuit between the lid 112 (contact A) and the showerhead 120 (contact C). Similarly, when the switch 180 is set to a second position SW2, the switch provides a short circuit between the showerhead 120 (contact C) and the ground terminal 184 (contact B). As such, when the sidewall 158 is formed from a conductive material, e.g., aluminum, the second position SW2 also corresponds to a short circuit between the showerhead 120 and the sidewall 158.

For better performance, connections to contacts A, B, and C are provided using conductors (e.g., wires, coaxial cables, and the like) of minimal impedance and length. In one further embodiment, the switch 180 may comprise more than one set of contacts such as contacts A, B, and C to enhance the operation of the switch (e.g., reduce contact resistance between contacts C and A in the first position SW1 or between contacts or C and B the a second position SW2).

The switch 180 may be operated manually or, alternatively, by an actuator 182 (e.g., a solenoid, linear motor, and the like), controlled, e.g., by the controller 110. In the depicted embodiment, the controller 110, using the actuator 182, may set the switch 180 to the first position SW1, to the second position SW2, or trigger the switch from one such position to another.

When the switch 180 is set to the first position SW1, the process chamber 102 is configured for performing a CVD or PECVD process. During such process, the process gas is supplied into the chamber. When the process chamber 102 performs a CVD process, no RF power is applied to the process chamber 102 (i.e., to the lid 112 and, respectively, to the showerhead 120). As such, during the CVD process, no plasma is developed in the chamber 102. Alternatively, when the process chamber 102 performs a PECVD process, the source 131 applies RF power to lid 112 (coupled further to the blocking plate 164) and the showerhead 120, and, as such, energizes the process gas to a plasma in the reaction volume 154.

When the switch 180 is set to the second position SW2, the process chamber 102 is configured for performing a cleaning process. During the cleaning process, cleaning gas is delivered into the chamber. When the cleaning process is performed, the source 131 applies RF power to the lid 112 (coupled further to the blocking plate 164), while the showerhead 120 is isolated from the lid and coupled to the ground terminal 184. In this configuration, the lid 112 (together with the blocking plate 164) and the showerhead 120 form a pair of spaced apart electrodes. When the source 131 applies RF power to such electrodes, the cleaning gas is energized to a plasma in the gas mixing plenum 152, however, no gas is energized to a plasma in the reaction volume 154.

In one alternative embodiment (not shown), an isolator may be installed to isolate the lid 112 from the blocking plate 164. In this embodiment, the showerhead 120 is electrically coupled to the blocking plate 164, while the isolator 176 isolates the showerhead 120 from the first portion 103. During the PECVD process (i.e., when the switch 180 is set to the first position SW1 and the source 131 applies RF power to the lid 112), the process gas may be energized to a plasma in the reaction volume 154, as discussed above in reference to FIG. 1. During the cleaning process (i.e., when the switch 180 is set to the second position SW2), the source 131 may energize the cleaning gas to a plasma within the first mixing plenum 162 using the blocking plate 164 as the electrode, while no gas is energized to the plasma in the reaction volume 154 or gas mixing plenum 152.

The process chamber 102 also comprises conventional systems for retaining and releasing the wafer 128, detection of an end of a process, internal diagnostics, and the like. Such systems are collectively depicted in FIG. 1 as support systems 107.

The controller 110 comprises a central processing unit (CPU) 124, a memory 116, and a support circuit 114. The CPU 124 may be of any form of a general purpose computer processor that can be used in an industrial setting. The software routines can be stored in the memory 116, such as random access memory, read only memory, floppy or hard disk drive, or other form of digital storage. The support circuit 114 is conventionally coupled to the CPU 124 and may comprise cache, clock circuits, input/output sub-systems, power supplies, and the like.

The software routines, when executed by the CPU 124, transform the CPU into a specific purpose computer (controller) 110 that controls the reactor 100 such that the processes are performed in accordance with the present invention. The software routines may also be stored and/or executed by a second controller (not shown) that is located remotely from the reactor 100.

Figure 2:
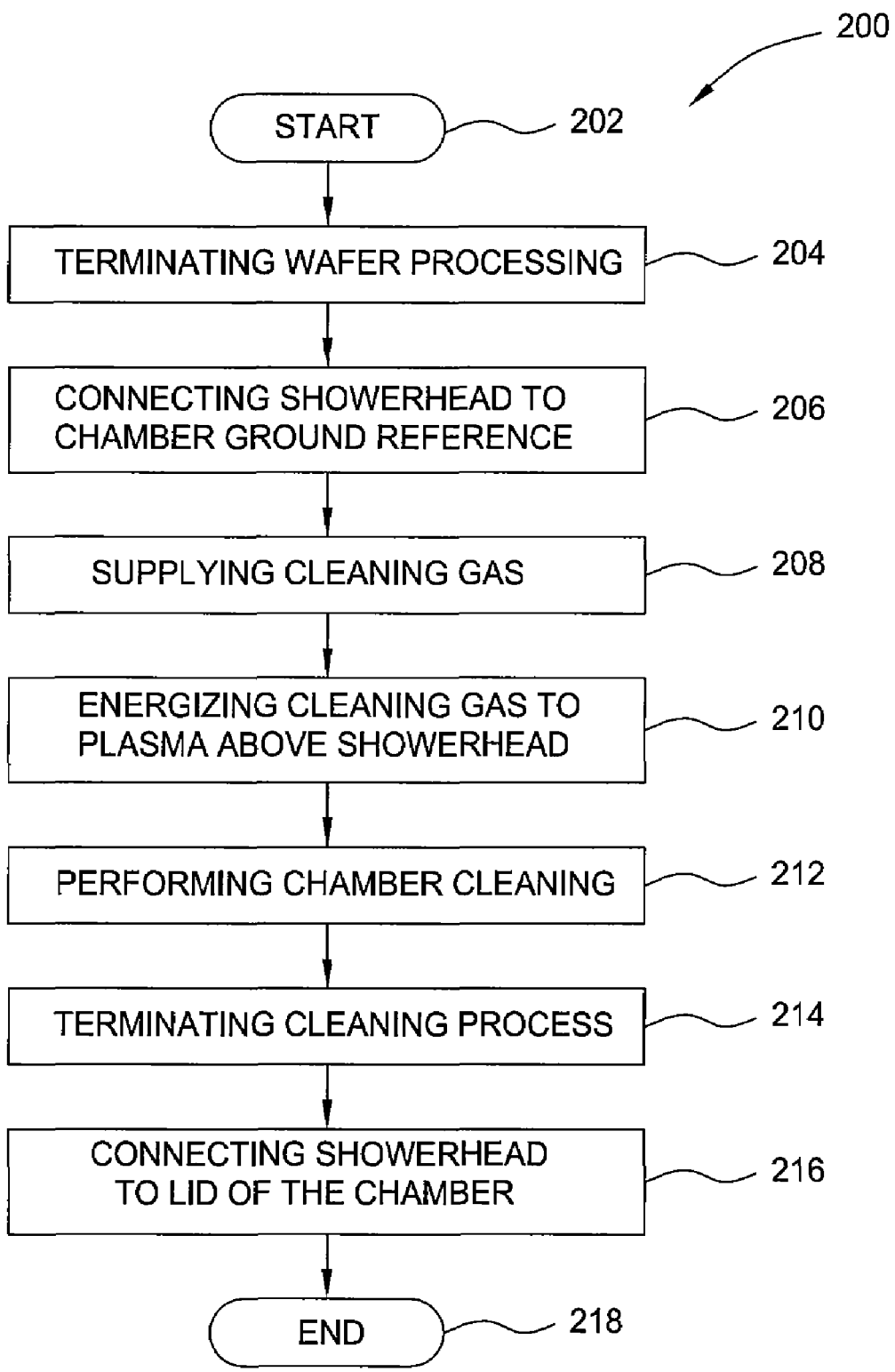
FIG. 2 depicts a flow diagram of a cleaning process in accordance with one embodiment of the present invention.

FIG. 2 depicts a flow diagram of an exemplary embodiment of the inventive method of cleaning the chamber 102 as a method 200. Generally, the method 200 is performed after the process chamber 102 has accumulated post-CVD deposits that should be removed before further processing may be performed in the chamber.

The method 200 starts at step 202 and ends at step 218.

At step 204, a CVD (or PECVD) process is terminated in the chamber 102. Step 204 terminates supplying power from the source 131 (PECVD process) and from the heater power supply 106. Alternatively, the heater power supply 106 may continue applying power during the following cleaning process to maintain the substrate pedestal 126 at a predetermined temperature. Further, step 204 stops supplying the process gas and the backside gas (e.g., helium). When pressure of the backside gas behind the wafer 128 becomes approximately equal to the gas pressure in the process chamber 102, step 204 releases the wafer 128 from the support pedestal 126 and removes the wafer out of the process chamber 102. Step 204 uses pump 104 to evacuate any traces of the process gas from the process chamber 102 and, as such, establishes vacuum in the chamber. During step 204, the switch 180 is set to the first position SW1, corresponding to a short circuit between the lid 112 and the showerhead 120 (described in reference to FIG. 1 above).

At step 206, the switch 180 is set to the second position SW2, corresponding to a short circuit between the showerhead 120 and the ground terminal 184, as described above in reference to FIG. 1.

At step 208, the cleaning gas is supplied, e.g., via the inlet port 160, into the process chamber 102 from the gas panel 108. In one embodiment, the cleaning gas comprises at least one gas such as nitrogen trifluoride ($NF_3$) and a carrier gas such as at least one of helium (He), argon (Ar) and the like. Other cleaning gases may comprise fluorine ($F_2$), sulfur hexafluoride ($SF_6$), fluorocarbons (e.g., $C_2F_6$, $C_2F_4$, and the like), carbon tetrachloride ($CCl_4$), hexachlorocarbide ($C_2Cl_6$), and the like. In one alternative embodiment, step 206 additionally applies power from the heater power supply 106 to the resistive heater 130 (or an optional source of radiant heat).

In one exemplary embodiment, step 208 supplies nitrogen trifluoride at a flow rate of about 500 to 6000 sccm, as well as helium at a flow rate of about 0 to 3000 sccm (i.e., a $NF_3$:He flow ratio ranging from 1:0 to 1:6). Step 208 also maintains gas pressure in the process chamber 102 between 1 and 6 torr and temperature of the support pedestal 126 between 200 and 450 degrees Celsius. One specific recipe supplies approximately 750 sccm of $NF_3$ and 500 sccm of He (i.e., a $NF_3$:He flow ratio of about 1:0.7), and maintains gas pressure at about 1.6 torr and temperature of the support pedestal at about 350 degrees Celsius.

In one alternative embodiment, step 208 may be performed before step 206. Further, steps 206 and 208 may be performed contemporaneously.

At step 210, the source 131 supplies RF power to the lid 112, thus energizing the cleaning gas to a plasma within the gas mixing plenum 152. The plasma dissociates the cleaning gas and produces free radicals and ionic species that can effectively transform the post-CVD residue in volatile compounds. At the same time, the free radicals and ionic species are chemically almost inert towards the materials (e.g., aluminum) used to form internal parts of the chamber 102 (e.g., the substrate pedestal 126, lining 113, and the like). A mixture of the free radicals and ionic species is further dispersed by the showerhead 120 into the reaction volume 154. From the reaction volume 154, the mixture propagates into other areas of the process chamber 102 and removes the post-CVD residue therein. A portion of the mixture also migrates into the first mixing plenum 162 and removes the residue from surfaces of the plenum.

The plasma of the cleaning gas is struck in close proximity to the showerhead 120, and, as such, recombination of the free radicals and ionic species in the reaction volume 154 is minimal. Specifically, the recombination is minimal in the apertures 172 and 168, as well as within the entire internal volume of the process chamber 102. The recombination of the free radicals and ionic species may further be reduced by controlling the power and frequency of the source 131. A level of RF power generally depends upon the thickness of accumulated post-CVD residue (deposits), chemistry of the cleaning gas, a predetermined duration of the cleaning process, a showerhead design, and the like. Similarly, the frequency of the applied RF power may depend on the chemical composition of the deposits and chemistry of the cleaning gas. In the exemplary embodiment discussed above, step 210 applies about 500 to 2500 W of RF power at 13.56 MHz, while one specific recipe applies 1000 W.

At step 212, the cleaning process is performed in the process chamber 102. During step 212, reactive components of the cleaning gas (i.e., free radicals and ionic species) etch the post-CVD deposits and transform the deposits into volatile compounds. The volatile compounds are then evacuated from the chamber through the exhaust port 186 using the vacuum pump 104. A duration of step 212 continues until the deposits are removed from internal parts of the process chamber 102.

In one exemplary application, the inventive method is used to clean the CVD chamber after a layer of low-k (i.e., low dielectric constant) dielectric material, such as, e.g., carbon doped silicon oxide, has been deposited upon about 2400 wafers. The carbon doped silicon oxide may be deposited by methods known in the art, such as methods disclosed in commonly assigned U. S. patent application Ser. No. 09/820,463, filed Mar. 28, 2001, which is incorporated herein by reference. In the exemplary embodiment when cleaning gas comprises nitrogen trifluoride and helium, a duration of the cleaning process of step 212 is between 2 and 6 minutes. In this application, the etch rate during the cleaning process is between about 120 and 250 Angstroms/sec, while the RF power from the source 131 is controlled in a range from about 500 to 1500 W. In one embodiment, the etch rate was about 195 Angstroms/sec at 1000 W.

The invention substantially improved performance of a conventional cleaning process. Using the invention, the service interval (i.e., a number of wafers processed in the process chamber between two consecutive cleaning processes) was increased for this application from about 2,400 wafers to approximately 10,000 wafers. As such, the invention improved throughput and productivity of the CVD chamber.

In an alternative embodiment, during step 212, the cleaning gas and RF power may be provided intermittently. In this embodiment, the cleaning gas and RF power are provided (i.e., active) during a first period of time and turned off (i.e., inactive) during a second period of time. As such, during the fist period, the cleaning process etches the deposits, transforms deposits into volatile compounds, and evacuates such compounds from the process chamber. Then, during the second period, the cleaning process restores vacuum in the process chamber. Such cycles of etching the post-CVD deposits and vacuum restoration are repeated until the deposits are removed from internal parts of the chamber. Generally, a duration of the first period is between 2 and 6 minutes, while the second period has a duration between 0 and 6 minutes. In one embodiment, the cleaning gas and RF power are provided for about 4 minutes, and then interrupted for approximately 4 minutes, i.e., the cleaning gas and RF power are active, together, with a duty cycle of about 50%.

At step 214, the cleaning process is terminated. Specifically, step 214 stops applying RF power from the source 131, as well as stops supplying the cleaning gas into the process chamber 102. As such, step 214 terminates plasma of the cleaning gas in the gas mixing plenum 152 and restores vacuum in the chamber. The heater power supply 106 may continue applying power to the resistive heater 130 to maintain the substrate pedestal 126 at a predetermined temperature, or may be shut off.

At step 216, the switch 180 is returned to the first position SW1. Similar to steps 206 and 208, in an alternative embodiment, steps 214 and 216 may be performed contemporaneously. At step 218, the method 200 ends.

FIG. 3 presents a table summarizing parameters through which one can practice the invention using the reactor of FIG. 1. The parameters for the embodiment of the invention presented above are summarized in FIG. 3. The process ranges and exemplary process data are also presented in FIG. 3. It should be understood, however, that the use of a different CVD reactor or CVD process may necessitate different process parameter values and ranges.

Although the forgoing discussion referred to cleaning of a CVD chamber, other process chamber can benefit from the invention. The invention can be practiced in other semiconductor processing systems wherein the processing parameters may be adjusted to achieve acceptable characteristics by those skilled in the art by utilizing the teachings disclosed herein without departing from the spirit of the invention.

While foregoing is directed to the illustrative embodiment of the present invention, other and further embodiments of the invention may be devised without departing from the basic scope thereof, and the scope thereof is determined by the claims that follow.

What is claimed is:

1. A semiconductor substrate processing system comprising a chamber for processing a substrate, said chamber comprising:
a first portion comprising a substrate support pedestal;
a second portion comprising a blocking plate electrode and a source of radio-frequency power;
a showerhead electrode electrically isolated from the first portion and the second portion; and
a switch with a first position and a second position, wherein the first position couples the showerhead electrode to the first portion and the second position couples the showerhead electrode to the second portion.

2. The system of claim 1, wherein the chamber is a chamber for performing a chemical vapor deposition process or a plasma enhanced chemical vapor deposition process.

3. The system of claim 1, wherein the first portion is further coupled to a ground reference of the chamber.

4. The system of claim 1, wherein blocking plate electrode and the showerhead electrode are electrically coupled.

5. The system of claim 1, wherein the showerhead electrode is electrically isolated using isolators formed from ceramic or polyimide.

6. The system of claim 5, wherein the isolators are formed from $Al_2O_3$.

7. The system of claim 1, wherein the switch couples the showerhead electrode to the first portion during plasma cleaning the chamber.

8. The system of claim 1, wherein the switch couples the showerhead electrode to the second portion during processing the substrate.

9. The system of claim 1, wherein the switch is a double-throw switch having a common terminal coupled to the showerhead electrode and selectable terminals coupled to the first portion and the second portion, respectively.

10. The system of claim 1, wherein the switch further comprises an actuator to operate the switch.

11. A semiconductor substrate processing system comprising a chamber for processing a substrate, said chamber comprises:
a first portion comprising a substrate support pedestal;
a second portion coupled to a source of radio-frequency power;
a showerhead electrically isolated from the first portion and the second portion; and
a switch with a first position and a second position, wherein the first position couples the showerhead electrode to the first portion and the second position couples the showerhead electrode to the second portion, and said source is a source of at least 500 W and about 50 kHz to 13.56 MHz.

12. The system of claim 11, wherein the showerhead is electrically isolated using isolators from ceramic or polyimide.

13. The system of claim 12, wherein the isolators are formed from $Al_2O_3$.

14. The system of claim 11, wherein the switch couples the showerhead to the first portion during plasma cleaning the chamber.

15. The system of claim 11, wherein the switch couples the showerhead to the second portion during processing the substrate.

16. The system of claim 11, wherein the switch is a double-throw switch having a common terminal coupled to the showerhead and selectable terminals coupled to the first portion and the second portion, respectively.

17. The system of claim 11, wherein the switch further comprises an actuator to operate the switch.

* * * * *